United States Patent
Jie et al.

(10) Patent No.: US 6,287,884 B1
(45) Date of Patent: *Sep. 11, 2001

(54) BURIED HETERO-STRUCTURE INP-BASED OPTO-ELECTRONIC DEVICE WITH NATIVE OXIDIZED CURRENT BLOCKING LAYER

(75) Inventors: Wang Zhi Jie; Chua Soo Jin, both of Singapore (SG)

(73) Assignee: Institute of Materials Research and Engineering, Singapore (SG)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/234,331

(22) Filed: Jan. 20, 1999

(30) Foreign Application Priority Data

Jan. 21, 1998  (SG) .................................................. 980015-0

(51) Int. Cl.[7] ...................................................... H01L 21/00
(52) U.S. Cl. ................................. 438/39; 438/46; 438/47
(58) Field of Search ................................ 438/933, 39, 41, 438/46, 47

(56) References Cited

U.S. PATENT DOCUMENTS

| | | | |
|---|---|---|---|
| 4,269,635 | * 5/1981 | Logan et al. | 438/40 |
| 4,408,331 | * 10/1983 | Hartman et al. | 372/46 |
| 5,719,891 | * 2/1998 | Jewell | 372/45 |
| 5,793,788 | * 8/1998 | Inaba et al. | 372/45 |
| 5,917,847 | * 6/1999 | Sun | 372/50 |

* cited by examiner

Primary Examiner—Andrew Tran
Assistant Examiner—Christian D. Wilson

(57) ABSTRACT

A buried hetero-structure with native oxidized current blocking layer for InP-based opto-electronic devices comprises a InP semiconductor substrate, a buffer layer, a ridge mesa containing lower confinement layer, active layer and upper grating confinement layer, a first InP cladding layer and a native oxidized Al-bearing layer as current blocking layers at both lateral edges, a second InP cladding layer, contact layer, contact metal, and the second ridge mesa covered with insulating layer. This method is to facilitate the processing of conventional buried hetero-structure InP-based opto-electronic device and improve the performance under high temperature and high current operation.

11 Claims, 3 Drawing Sheets

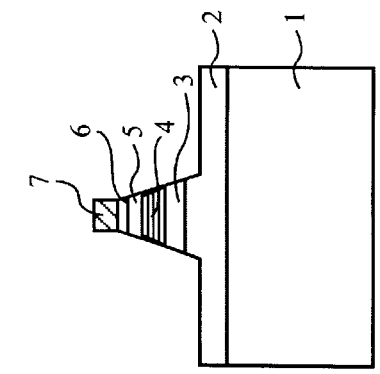
FIG. 1A
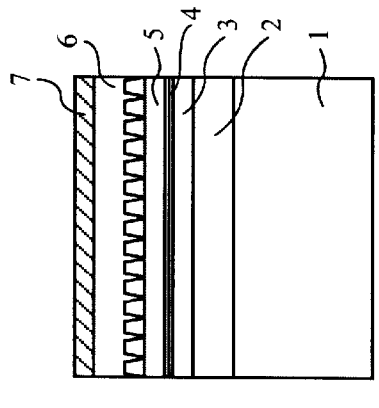
FIG. 1B
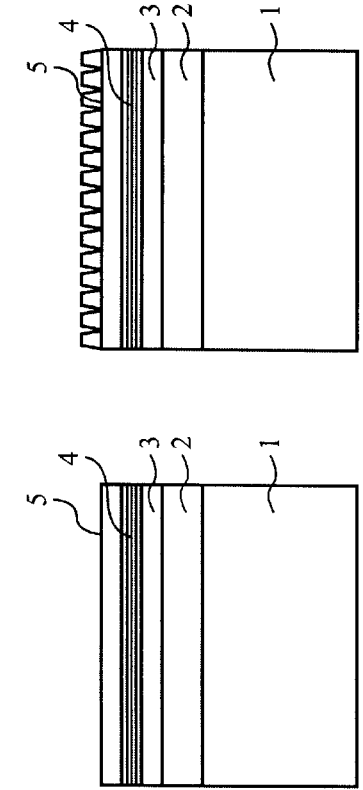
FIG. 1C
FIG. 1D
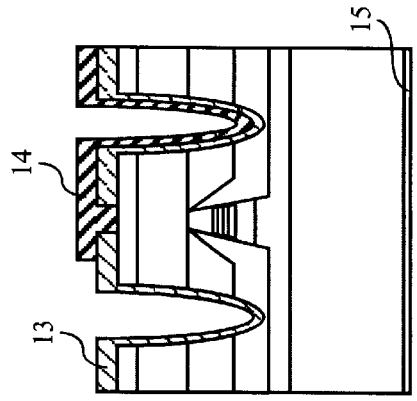
FIG. 1E
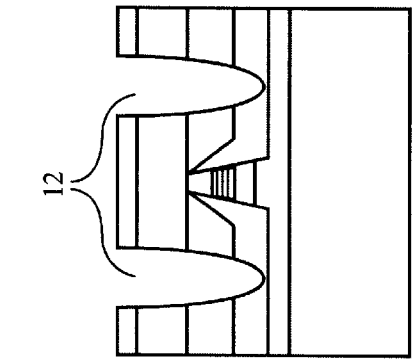
FIG. 1F
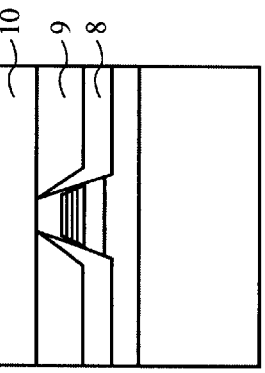
FIG. 1G
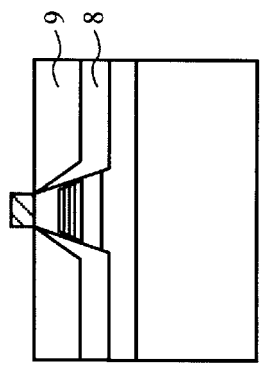
FIG. 1H

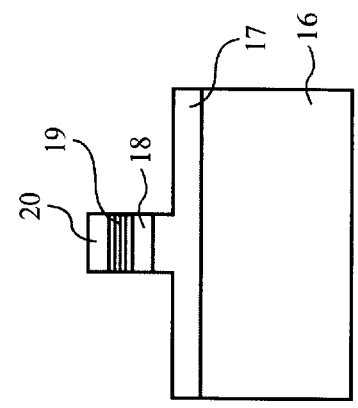
FIG. 3C
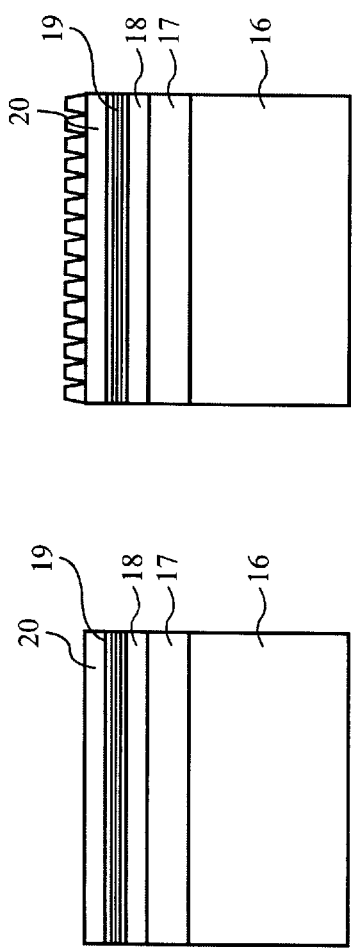
FIG. 3B
FIG. 3A
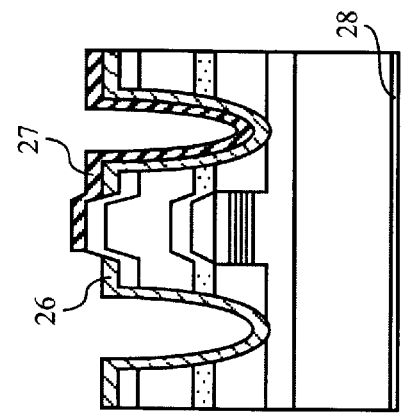
FIG. 3F
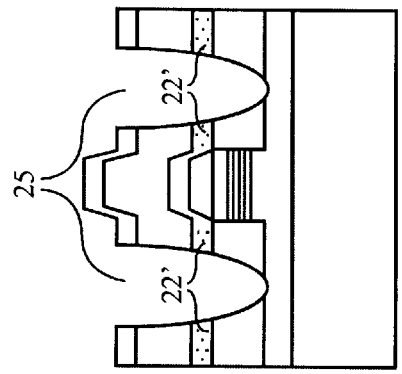
FIG. 3E
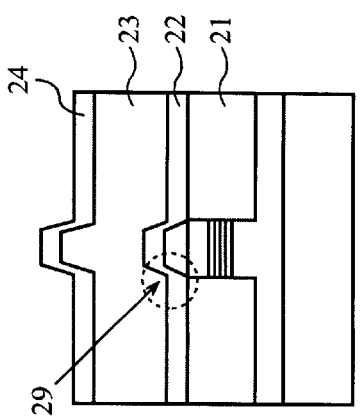
FIG. 3D

BURIED HETERO-STRUCTURE INP-BASED OPTO-ELECTRONIC DEVICE WITH NATIVE OXIDIZED CURRENT BLOCKING LAYER

FIELD OF THE INVENTION

The present invention relates to buried hetero-structure InP-based opto-electronic devices and more specifically to an improved method of manufacturing such devices.

BACKGROUND OF THE INVENTION

It is well-known that InP-based opto-electronic devices, such as distributed feedback (DFB) laser, distributed bragg reflector (DBR) laser, Fabry-Perot (FP) laser, waveguide, optical switch, amplifier, modulator and integrated devices etc., play an important role in optical fiber communication systems. Optical fiber communication systems require high performance lasers which are characterized by low threshold, high linear power output, stable fundamental mode, high modulation response, high temperature operation, etc.

There are two common types InP based lasers used for opto-communication systems. The first type is weak index-guided laser, which requires that the thickness of at least one layer be laterally non-uniform. An example is ridge waveguide (RWG) laser, where the cladding layer is etched into ridge type, and the active layer laterally extends beyond ridge. the optical confinement is formed by the index step ($\sim 10^{-2}$) by both ridge waveguide geometry effective index step and the carrier induced index change. But the carriers are still not confined laterally. These type of lasers can be easily fabricated, for the FP lasers only require one epitaxy growth for DFB lasers it only require two types of lasers. But due to the intrinsic mechanism of weak index guided laser, in some functions, such as stable fundamental mode controlling, they are not good enough.

The second type of laser is the strongly index-guided laser where the active layer is surrounded by a larger band gap, low index material (the index step is about 0.2) which forms a carrier and optical confinement, such as buried hetero-structure (BH) with reverse P-N junction lasers, The InGaAsP active strip is buried with a larger band gap InP material, and so the regrown material block current flows through reverse-biased junctions. So this type lasers combines all the good features of current, carrier, and photon confinements, which could satisfy the most demanding application in the fiber optical communication systems.

However, the conventional fabrication process of such BH InP-based opto-electronic devices is very complicated. Without loss of generality, we will focus on the DFB laser for the following introduction because BH DFB laser is the most important device and is also the most difficult device to fabricate. Other BH InP-based devices can be similarly fabricated without grating. FIG. 1 illustrates a typical buried hetero-structure DFB laser processing procedure, which comprises the following steps: (1) FIG. 1a: first growth of buffer layer, cladding layers and active layer; (2) FIG. 1b: fabrication of grating and (3) FIG. 1c: regrowth of cladding layer; (4) FIG. 1d: deposition of dielectric film such as $SiO_2$ or $Si_3N_4$ film and wet etching above layers into specific strip rib; (5) FIG. 1e: selective regrowth of p-n current block layer; (6) FIG. 1f: removal of dielectric film and regrowth of the cladding and contact layer; (7) FIG. 1g: wet etching to form two grooves parallel to the first rib to reduce the device capacitance; (8) FIG. 1h: deposition of dielectric layers and etching out a window for the contact layer and finally, evaporation of contact metals for both n and p metallisation.

The complexity of the regrowth, selective regrowth, cleaning, deposition and removal of dielectric film, and wet etching of the stripe mesa, greatly increases the cost of BH DFB lasers and reduces the yield.

Moreover, as can be seen in FIG. 2(a), for this type of BH laser, there are unavoidable leakage currents both from I to II and from III to IV for the pnpn type thyristor. From the equivalent circuit FIG. 2(b), the anode current $I_A$ until the thyristor break over could be:

$$I_A = [Io + (\alpha_2 \cdot M_n \cdot I_g)]/[1-(\alpha_1 \cdot M_p + \alpha_2 \cdot M_n)] \quad (1)$$

Where $I_o$: a leakage current of the junction $J_2$ $I_g$: gate current $\alpha_1$: common based current gain of transistor $T_{r1}$ $\alpha_2$: common based current gain of transistor $T_{r2}$ $M_n$: avalanche amplification factor for the electrons in the depletion layer of junction $J_2$ $M_p$: avalanche amplification factor for the holes in the depletion layer of junction $J_2$.

As can be seen from the equation (1), the break-over conditions of the thyristor are represented by the following equation (2).

$$\alpha_1 \cdot M_p + \alpha_2 \cdot M_n = 1 \quad (2)$$

The $\alpha_1$ and $\alpha_2$ of the equation (2) are drastically increased normally when the anode current $I_A$ increases or the temperature of the diode rises.

Further, the $M_n$ and $M_p$ generally have the dependency as represented by the following equation (3). In the equation (3), in the case of $V<<V_{a1}$ $M=1$ is satisfied, but as the V approaches $V_a$, the M is drastically increased.

$$M = 1/[1-(V/V_a)^2] \quad (3)$$

Because of such behaviors of $\alpha$ and the M together with the relationship of the equation (1), increases in the gate current and the applied voltage $V_a$, and temperature rise cause an increase in the anode current of the thyristor. Further, since a positive feedback system of increasing the $\alpha_1$ and $\alpha_2$ due to the increase in the anode current is formed, the thyristor feasibly break over. So the leakage current under high temperature and high output power operation is unavoidable for the p-InP/n-InP reversed biased junction BH laser.

To address the above mentioned problems, we propose to replace InP p-n reverse junction block layer in conventional buried heterostructure (BH) InGaAsP/InP lasers by Al-bearing compound native oxide layer. This type of laser device not only keeps good features of the conventional BH laser by more facilitated processing method, but also the high insulation characteristic of native oxide will avoid the leakage current from p-n-p-n InP thyristor like junction dependence on the temperature and high power operation, so it will improve the high temperature and high power performance of the conventional BH InGaAsP laser.

There has been an interest in the recent years to apply Al-bearing compound native oxide layer to opto-electronic devices because it is an insulator layer and has a low refractive index (n~1.6). The native oxide of Al-bearing compounds provides both electrical and optical confinement and, moreover, simplifies processing of the lasers. The principle of native oxidation is to expose heated Al-bearing materials in water vapor saturated gaseous ambient to form an anhydrous oxide of Aluminum which is very stable and does not degrade under normal operating conditions. This thickness of this type of oxide layer is the same or less than the thickness of the as-grown Al-bearing materials and it does not cause disruption or induce strain. Moreover, the refractive index is less than 2, and therefore the oxidized layer will facilitate electron block and optical confinement.

For the surface-emitting lasers, AlAs oxide has been successfully used for DBR structures and for current constriction to achieve low threshold devices. For edge emitting lasers, the native oxide of AlGaAs has been utilized to fabricate stripe-geometry lasers and index-guided buried ridge waveguide lasers. This technology is widely used for GaAs-based optoelectronic devices containing Al-bearing materials such as AlAs, AlGaAs, AlInP etc.. See U.S. Pat. Nos. 5,262,360 by N. Holonyak, Jr and J. Dadallesasse (AlGaAs native oxide), 5,550,081 by N. Holonyak, Jr., S. A. Maranowski., method of semiconductor device by oxidizing Aluminum-bearing III–V semiconductor in water vapor environment), S. A. Maranowski, A. R. Sugg, E. I. Chen, and N. Holonyak, Jr., Appl. Phys.Lett. 63, 1660 (1993), Y. Cheng, P. D. Dapkus, M. H. MacDouugal, and G. M. Yang, IEEE Photonics Technol, Lett. 8, 176 (1996), J. J. Wierer, S. A. Maranowski, N. Holonyak, Jr., P. W. Evans, and E. I. Chen, Appi, Phys. Lett. 8, 176 (1996), D. L. Huffaker, D. G. Deppe, Kumar, and T. J. Rogers, Appi. Phys. Lett. 65. 97 (1994), K. L. lear, K. D. Choquette, R. P. Schneider, Jr., S. Kiloyne, and K. M. Geib, Electron. Lett. 31, 208 (1995), B. J. Thibeault, E. R. Hegblom, P. D. Floyd, R. L. Naone, Y. Akulova, and L. A. Coldren, IEEE Photonics Technol. Lett.8, 593 (1996), P. D. Floyd, B. J. Thibeault, E. R. Hegblom, J. Ko, L. A. Coldren, and J. L. Merz, IEEE Photonics Technol, Lett. 8, 590 (1996).

So far, advances in the Al-bearing native oxidation in InP-based devices have been much slower. The native oxide of InAIAs, lattice-matched to InP, has been employed in the long wavelength InP/InGaAsP gain-guided or weak index guided buried ridge waveguide lasers, and as a gate insulator in a InAlAs/InGaAs MOSFET. There has also been a report using native oxide of AlAsSb, lattice-matched to InP with Al mole fraction of 1.0.

Here, we propose to apply Al-bearing oxide to InP-based BH lasers to facilitate conventional InP based BH laser processing and prevent leakage current for the conventional BH laser.

SUMMARY OF THE INVENTION

Therefore, it is the object of the present invention to provide a cost-effective method of producing InP-based devices and improve the current blocking characteristics to suppress the leakage current under high temperature and high output power.

In this invention, the applicants propose to grow Al-bearing material as cladding layer on InP based laser structure instead of the growth of reverse p-n junction as current blocking layers, and to utilize native oxidation technique to form a current blocking layer in the lateral part of the Al-bearing cladding layer, whereas the center non-oxidized region allows current passage. Therefore, this technique can avoid the second regrowth, selective regrowth, deposition and removal of dielectric film and several cleaning procedures proceeding each step. It also obviates the rigid requirement of the special shape of the ridge rib to prevent $SiO_2$ polycrystal deposition. It only requires two regrowth steps, so the fabrication of BH DFB laser could be greatly facilitated by utilizing native oxidation.

The Al-bearing layer non-planer growth on the active strip mesa will form a lateral growth step just around active mesa sides. Due to the fact that InAlAs oxidant diffusion rate is the rate limiting mechanism, the InAlAs oxide laterally travels and terminates at the corner of the Al-bearing non-planar growth step. It can easily achieve good current blocking performance as selective regrowth n-type current block layer in the conventional fabricating method.

In the conventional method of wet oxidation of InAlAs single layer, the oxidation rate is usually much slower, normally about 2~3 $\mu$m per hour at 500° C. In the present invention, we use mixed InAlAs layers with high Al composition, which contain higher Al-composition to accelerate oxidation.

Moreover, the high insulating characteristic of Al-bearing oxide will suppress the current leakage for conventional pnpn thyristor during high temperature or high current operation.

BRIEF DESCRIPTION OF THE DRAWINGS

FIGS. 1a through 1h (Prior Art) illustrate the conventional method for fabricating BH DFB lasers.

FIGS. 3a through 3f illustrate the preferred fabrication method for the oxidized BH DFB laser.

DETAILED DESCRIPTION OF THE INVENTION

Figure 2A:
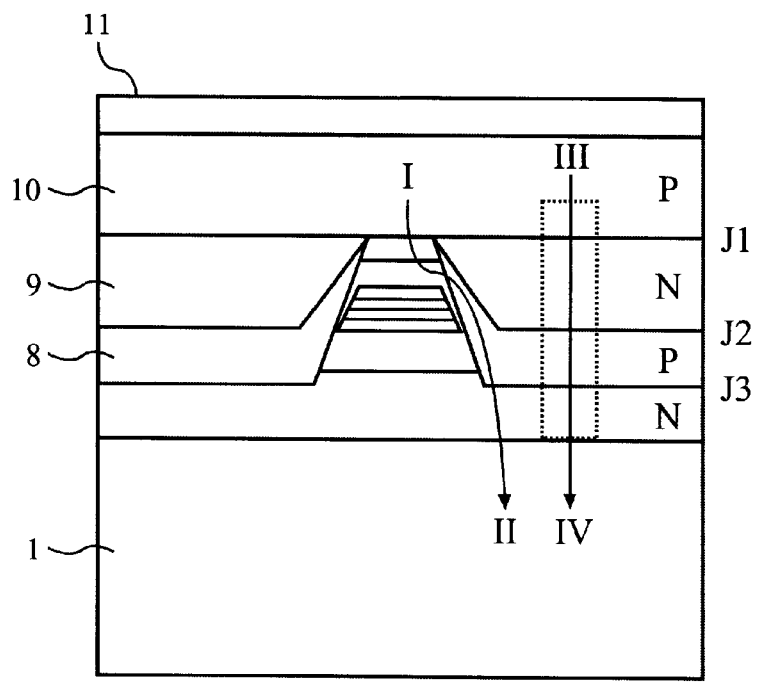
FIGS. 2a and 2b (Prior Art) illustrate the current leakage problem for the conventional BH laser.
Figure 2B:
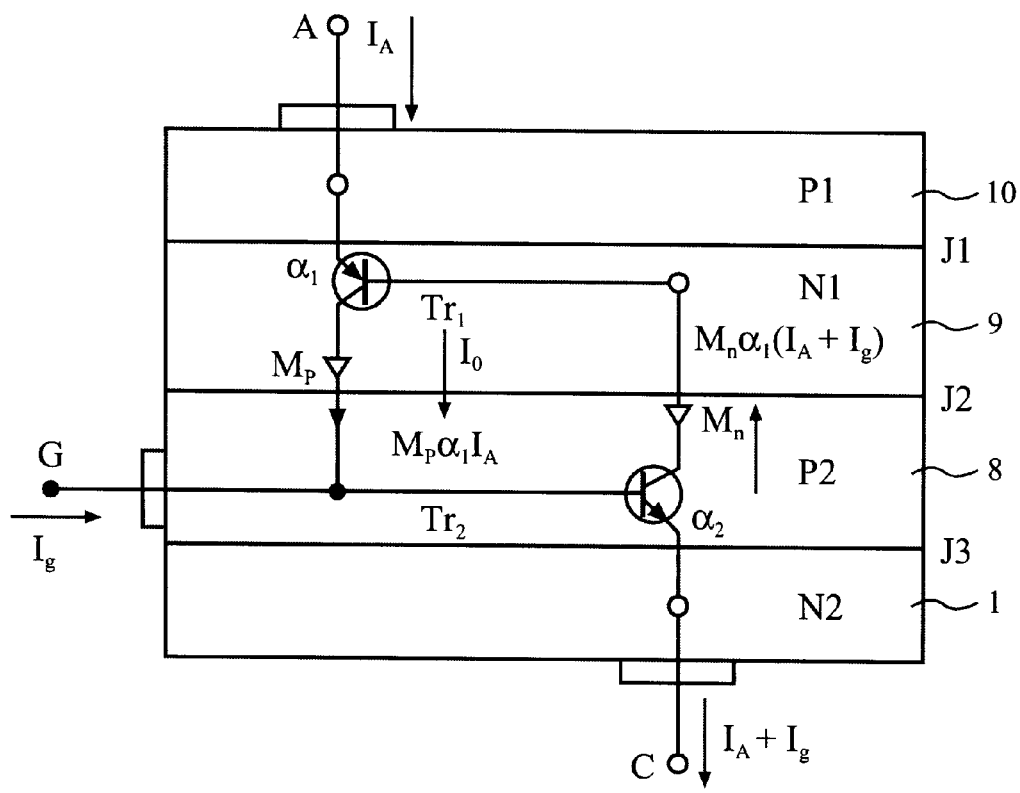

In order to better describe the present invention, a brief description of the processing method for the conventional BH DFB laser is given, as is illustrated in FIGS. 1a through 1h. The procedure comprises of the following: (1) FIG. 1a: A n-doped InP buffer layer 2, lower confining layer 3, active layer 4 and upper confining layer 5 are grown on InP substrate 1; (2) FIG. 1b: Fabrication of the grating on the surface of layer 5; (3) FIG. 1c: Regrowth a p-InP cladding layer 6 on the grating layer 5; (4) FIG. 1d: Deposition of dielectric layer 7 on the regrowth layer 6 and the wet etching of layers 7, 6, 5, 4, 3, and part of layer 2 into a 2 $\mu$m wide ridge rib with the ridge direction normal to the grooves of the grating. The shape of the rib is strictly controlled to avoid polycrystal deposition on the dielectric film cap layer 7 during the next selective regrowth. (5) FIG. 1e: p-InP layer 8 and n-InP layer 9 are selectively grown on both sides of the rib without depositing on the, dielectric film 7, so that they will automatically form a lateral current blocking layer beside the active layer; (6) FIG. 1f: Regrowth of p-InP cladding layer 10 and p$^+$-InGaAs contact layer 11 on the cladding layer 6 after removal of the film 7; (7) FIG. 1g: To increase the modulation bandwidth, it is required to reduce the capacitance of the device by etching two parallel grooves 12 along either side of the first stripe ridge; (8) FIG. 1h: Deposition of the dielectric film 13 and with a etched window for the p-metal contact 14 to contact layer 13. Contact metal 14 is just deposited on one side of the groove with specific shape for high speed modulation. The thinned down substrate is deposited with n-type contact metal 15.

The present invention is described in FIGS. 3a through 3f. The process comprises the following steps: (1) FIG. 3a: A n-typed InP buffer layer 17, lower confining layer 18, active layer 19 and upper confining layer 20 are grown on the substrate 16; (2) FIG. 3b: Fabrication of the grating on the surface of layer 20; (3) FIG. 3c: Wet etching or reactive ion etching (RIE) of layer 17, 18, 19, 20 into <2 $\mu$m wide ridge rib with the ridge direction normal to the grating grooves, the height of the rib is equal to the thickness of the following growth layer 21, the strip mesa is along the [110] crystallographic direction, the shape of mesa could be straight or reverse-mesa; (4) FIG. 3d: Regrowth p-InP cladding layer 21, p-type Al-bearing material 22, p-InP cladding layer 23 and p$^+$-InGaAs contact layer 24 on the above said ridge; (5) FIG. 3e: Deposit $SiO_2$ or $Si_3N_4$ film on the wafer as a following etching mask and long term oxidation protection mask (if oxidation time is less than 1 hour, this step could be omitted), patterning align two parallel grooves 25 along either side of the ridge rib, which kept on the middle, wet etching, and utilizing the native oxidation technique to form current blocking layer along the lateral side of the Al-bearing layer 22 while the central part remains non-oxidized for current passage; (6) FIG. 3f: Deposition of the dielectric film 26 and with a etched window for the P-metal contact 27 to contact layer 24, contact metal 27 is just deposited on one side of the groove with specific shape for high speed modulation. The thinned down substrate is deposited with n-type contact metal 28.

In the above-mentioned two structures, the layers before fabrication of the grating are the same. The InP substrate 1 and 16 is n-doped (~$10^{18}$ cm$^{-3}$); the n-InP buffer layer 2 and 17 (~$8\times10^{18}$ cm$^{-3}$) is about 1 $\mu$m thick; the undoped lower confinement separate layer 3 and 18 and the undoped upper confinement layer 5 and 20 are about 800~1500 Å thick. Their energy band gap should be larger enough to form a electronic barrier. The active layer 4 or 19 could be a bulk structure, a quantum well structure or a strained or strain balanced quantum well structure. The confinement layer and active layer could be InGaAsP or AlGaInAs quaternary material system, which satisfies the requirement of a laser, such as electrical and optical confinement.

For the conventional structure, p-InP cladding layer 6 (~$5\times10^{17}$ cm$^{-3}$) is about 1 $\mu$m thick; the current blocking InP layer 8 ( p-type doped with ~$2\times10^{18}$ cm$^{-3}$) and layer 9 (n-doped ~$2\times10^{18}$ cm$^{-3}$) are both about 0.5~1.5 $\mu$m thick; the p-InP cladding layer 10 (~$5\times10^{17}$ cm$^{-3}$) is about 1.5~2.0 $\mu$m thick; The p$^+$-InGaAs contact layer ($10^{18}$~$10^{19}$ cm$^{-3}$) is less than 1.0 $\mu$m.

For the present invention, however, the thickness p-InP cladding layer 21 (~$5\times10^{17}$ cm$^{-3}$) is from 0 $\mu$m to the height of active mesa(composed with the layers 17, 18, 19, 20). Preferably it's thickness should be the same as the height of the active mesa.

The p-doped Al-bearing material 22 (~$5\times10^{17}$ cm$^{-3}$) preferably be $Al_xGa_yIn_{1-x-y}As$ bulk, $Al_xGa_yIn_{1-x-y}As$/$Al_xGa_yIn_{1-x-y}As$ mixed multiple layers or AlAsSb, which could be oxidized without resulting in defect and device degradation, normally x>0.4 and 0<y<1. The designed mixed layers containing high Al composition is to accelerate the oxidation process. Along the side part of the active mesa, the bottom of Al-bearing layers should be lower and just surpassed over the top of the active mesa, and the top of the Al-bearing layers should surpass the top of the active mesa. The total thickness of Al-bearing layers is in an range of 20 nm to 1 $\mu$m, The non-planer regrowth of layer 22 forms a growth step 29 around active mesa, the step will form an oxidation barrier, i.e making oxide 22' travel and terminate at step 29. This is because the InAlAs oxidant diffusion rate is the rate limited mechanism. This mechanism also reduces the rigid requirement for the photolithography alignment in the double groves etching, and make the oxidation reproducible comparing with planer lateral oxidation.

The p-InP cladding layer 23 (~$2\times10^{18}$ cm$^{-3}$) is 2 $\mu$m or less in thickness; and the p$^+$-InGaAs contact layer ($10^{18}$~$10^{19}$ cm$^{-3}$) is about <1.0 $\mu$m.

The above-mentioned epitaxial layers are grown under low pressure using the MOVPE technique. The dielectric films 7, 13 and 27 are deposited by a plasma CVD method, and they could be $SiO_2$ film or $Si_3N_4$ films. The contact metals 14 or 27 are p-ohmic contact which could be Au—Pt—Ti, while contact metals 15 and 28 are n-ohmic contact which could be Au—Ge—Ni, which can be thermally evaporated or sputter-deposited onto the contact epitaxial layer. The contact metal 14 and 27 could be patterned by using conventional photoresist lift-off technique.

The grating formed on the layer 5 and 20 is fabricated by holographic photoresist and ($CH_4/H_2$) reactive ion etching (RIE) technique. The ridge rib and grooves are formed by wet etching, and the etching solution could be Br:HBr:H$_2$O (1:8:25). The dielectric film, such a $SiO_2$ is etched either by RIE or wet etching.

The oxidation is carried out by heating the wafer in a water-containing environment up to a temperature of about 350 to 550° C. Such a moist environment may be generated by flowing a gas, such as nitrogen through water heated to about 80–90° C. The flow of the water vapor is continued for about half an hour to 10 hours.

Thus, it will be understood that the present invention makes it possible to facilitate the fabrication of conventional buried hetero-structure distributed feedback laser.

Without the fabrication of grating, we can similarly fabricate other InP-based opto-electronic devices, such as BH FP laser, optical amplifier, switch, modulator and integrated devices using this native oxidization BH technology.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims and all changes which come within the meaning and range of equivalency of the claims are, therefore, to be embraced therein.

We claim:

1. A method of fabricating a native oxidized buried heterostructure InP-based device comprising:

providing a strip mesa grown on a substrate, the mesa having an InP buffer layer, a lower confining layer, an active layer, and an upper confining layer, the strip mesa being formed by etching out ridge ribs;

growing a first p-InP cladding layer along the ridge wherein a height of the p-InP cladding layer is substantially equal to a height of the strip mesa;

growing a non-planar Al-bearing layer on top of the p-InP cladding layer wherein a bottom side of the Al-bearing layer along the ridge is slightly lower than a top of the mesa, and which goes over the top of the mesa to create a step around the mesa;

growing a second p-InP cladding layer on top of the Al-bearing layer;

growing a contact layer on top of the second p-InP cladding layer;

creating parallel grooves along the ribs and oxidizing along a lateral side of the Al-bearing layer to form a current blocking layer;

depositing a dielectric film over a surface of the grooves;

etching out a window on the mesa over the contact layer;

depositing a p-metal contact over one of the grooves including the window; and depositing an n-type contact metal over the n-InP substrate.

2. The method as recited in claim 1 wherein the a thickness of the Al-bearing layer is in the range of 20 nm to 1 μm.

3. The method as recited in claim 1 wherein the Al-bearing layer is formed from a p-doped material having a formula $Al_xGa_yIn_{1-x-y}As$.

4. The method as recited in claim 1 wherein the Al-bearing layer is formed from a p-doped mixed, multiple layer material having a formula $Al_xGa_yIn_{1-x-y}As/Al_xGa_yIn_{1-x-y}As$.

5. The method as recited in claim 1 wherein the Al-bearing layer is formed from a p-doped material having a formula AlAsSb.

6. The method as recited in claim 1 wherein the second p-InP cladding layer is 2 μm or less in thickness.

7. The method as recited in claim 1 wherein the contact layer on top of the second p-InP cladding layer is formed from $p^+$-InGaAs.

8. The method as recited in claim 1 wherein the confinement layer and active layer are made of InGaAsP quartenary material.

9. The method as recited in claim 1 wherein the confinement layer and active layer are made of AlGaInAs quartenary material.

10. The method as recited in claim 1 wherein the ridges are formed by wet etching after fabricating gratings on the upper confinement layer.

11. The method as recited in claim 1 wherein the ridges are formed by reactive ion etching after fabricating gratings on the upper confinement layer.

* * * * *